(12) United States Patent
Kelley

(10) Patent No.: US 12,414,270 B2
(45) Date of Patent: Sep. 9, 2025

(54) SYSTEMS AND METHODS FOR ADJUSTING PRESSURE IN IMMERSION-COOLED DATACENTERS

(71) Applicant: Microsoft Technology Licensing, LLC, Redmond, WA (US)

(72) Inventor: Douglas Patrick Kelley, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 629 days.

(21) Appl. No.: 17/697,733

(22) Filed: Mar. 17, 2022

(65) Prior Publication Data

US 2023/0301026 A1   Sep. 21, 2023

(51) Int. Cl.
H05K 7/20 (2006.01)

(52) U.S. Cl.
CPC ......... H05K 7/20381 (2013.01); H05K 7/203 (2013.01); H05K 7/20309 (2013.01); H05K 7/20318 (2013.01); H05K 7/20327 (2013.01)

(58) Field of Classification Search
CPC ............... H05K 7/20381; H05K 7/203; H05K 7/20309; H05K 7/20318; H05K 7/20327; H05K 7/20236
See application file for complete search history.

(56) References Cited

U.S. PATENT DOCUMENTS

| 10,966,349 B1 * | 3/2021 | Lau | H05K 7/20236 |
| 11,990,598 B1 * | 5/2024 | Ahmad | F04B 19/24 |
| 2011/0289204 A1 * | 11/2011 | Hansson | H04L 67/1008 718/1 |
| 2014/0218858 A1 | 8/2014 | Shelnutt et al. | |
| 2015/0104160 A1 * | 4/2015 | Butler | F24H 1/202 219/510 |
| 2020/0127351 A1 * | 4/2020 | Smith | H01M 10/613 |
| 2021/0120705 A1 * | 4/2021 | Enright | H05K 7/203 |
| 2021/0153392 A1 | 5/2021 | Gao | |

FOREIGN PATENT DOCUMENTS

JP    2005049964 A  *  2/2005

OTHER PUBLICATIONS

"International Search Report and Written Opinion Issued in PCT Application No. PCT/US22/053296", Mailed Date: Mar. 20, 2023, 14 Pages.

* cited by examiner

*Primary Examiner* — Harry E Arant
(74) *Attorney, Agent, or Firm* — Ray Quinney & Nebeker P.C.; Paul N. Taylor

(57) ABSTRACT

In some embodiments, a thermal management system includes an immersion tank defining an immersion chamber, a two-phase working fluid positioned in the immersion chamber, and a pressure trim device in fluid communication with the immersion chamber. The pressure trim device includes at least one of a cold thermal sink and a hot thermal sink. The cold thermal sink is maintained at a suppressed temperature less than a boiling temperature of the two-phase working fluid. The hot thermal sink is maintained at an elevated temperature greater than a boiling temperature of the two-phase working fluid.

19 Claims, 5 Drawing Sheets

SYSTEMS AND METHODS FOR ADJUSTING PRESSURE IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management. Vaporization and condensation of immersion working fluid can alter the fluid pressure inside an immersion cooling system.

BRIEF SUMMARY

In some embodiments, a thermal management system includes an immersion tank defining an immersion chamber, a two-phase working fluid positioned in the immersion chamber, and a pressure trim device in fluid communication with the immersion chamber. The pressure trim device includes at least one of a cold thermal sink and a hot thermal sink. The cold thermal sink is maintained at a suppressed temperature less than a boiling temperature of the two-phase working fluid. The hot thermal sink is maintained at an elevated temperature greater than a boiling temperature of the two-phase working fluid.

In some embodiments, a thermal management system includes an immersion tank defining an immersion chamber, a two-phase working fluid positioned in the immersion chamber, a pressure trim device in fluid communication with the immersion chamber, a fluid control mechanism, and a controller. The pressure trim device includes at least one of a cold thermal sink and a hot thermal sink. The cold thermal sink is maintained at a suppressed temperature less than a boiling temperature of the two-phase working fluid. The hot thermal sink is maintained at an elevated temperature greater than a boiling temperature of the two-phase working fluid. The fluid control mechanism is configured to adjust a flowrate of working fluid from the immersion tank to the pressure trim device. The controller is in communication with the fluid control mechanism to control a position of the fluid control mechanism.

In some embodiments, a method of thermal management includes measuring at least one operating property of an immersion cooling system, determining a position of a fluid control mechanism based at least partially on the operating property, moving at least a portion of the fluid control mechanism to the position, allowing a portion of a working fluid to move from an immersion tank to a pressure trim device, changing a physical state of the working fluid with the pressure trim device, and returning to the immersion tank at least part of the portion of the working fluid after changing the physical state of the portion of the working fluid.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

Figure 1:
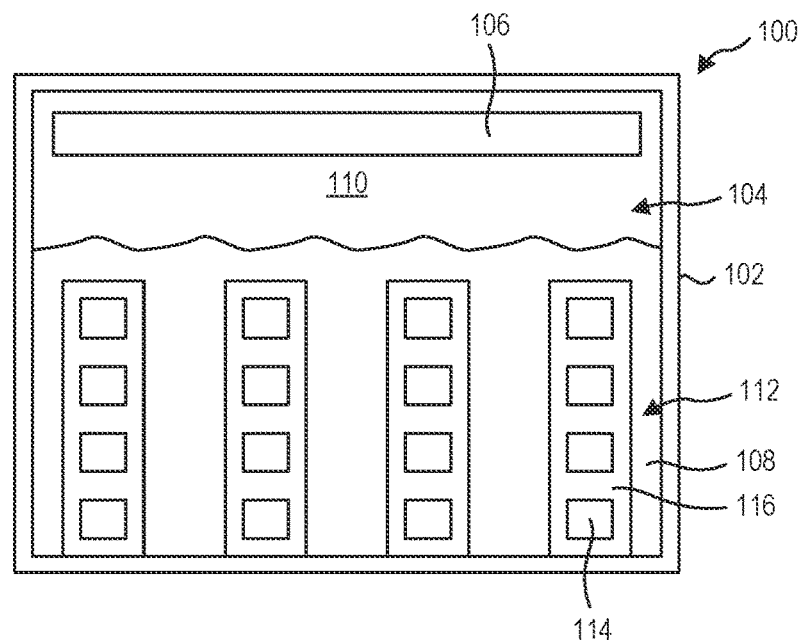
FIG. 1 is a side schematic representation of an immersion cooling system, according to at least one embodiment of the present disclosure.

The present disclosure relates generally to systems and methods for thermal management of electronic devices or other heat-generating components. In some embodiments, immersion cooling systems described herein allow for changes to be made to a fluid pressure in an immersion tank. The changes to the fluid pressure can maintain the fluid pressure within a safe range in the tank. For example, an immersion cooling system according to the present disclosure includes one or more pressure trim devices to vaporize or condense a portion of the working fluid to adjust the fluid pressure in the immersion tank. Many immersion tanks are designed, based on transport, manufacturing, and maintenance constraints, to handle a range of about 3 Atmospheres (ATM) of pressure difference across the walls, cover, or seals of the tank. Exceeding that pressure difference can damage or rupture the tank.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

The changes in volume between the liquid phase and vapor phase of the working fluid changes the pressure in the immersion tank. In some embodiments, a condenser, heat exchanger, or other device for cooling the vapor working fluid cannot change state quickly enough to respond to changes in compute demand and/or heat-generation of the electronic components in the immersion tank. More specifically, the heat-generation by the electronic components in the immersion tank is based on electrical power consumption and compute load. Assignment of a computational task, and associate compute load of the server computers in the immersion tank, can change more rapidly than the thermal capacity of the condenser, heat-exchanger, or other device cooling the working fluid.

In an example, a step-increase in compute load produces a step-increase in vaporization rate of the working fluid by the heat-generating components, while a condenser tasked with condensing the vapor working fluid has a relatively prolonged reaction time before a steady-state is achieved. In the time between the heat-generating components vaporizing more working fluid and the condenser responding, the fluid pressure in the immersion tank may increase. In another example, a step-decrease in compute load produces a step-decrease in vaporization rate of the working fluid by the heat-generating components, while a condenser tasked with condensing the vapor working fluid has a relatively prolonged reaction time before a steady-state is achieved. In the time between the heat-generating components vaporizing additional working fluid and the condenser responding, the fluid pressure in the immersion tank may decrease as the condenser continues condensing the vapor working fluid, despite the heat-generating components vaporizing less working fluid.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
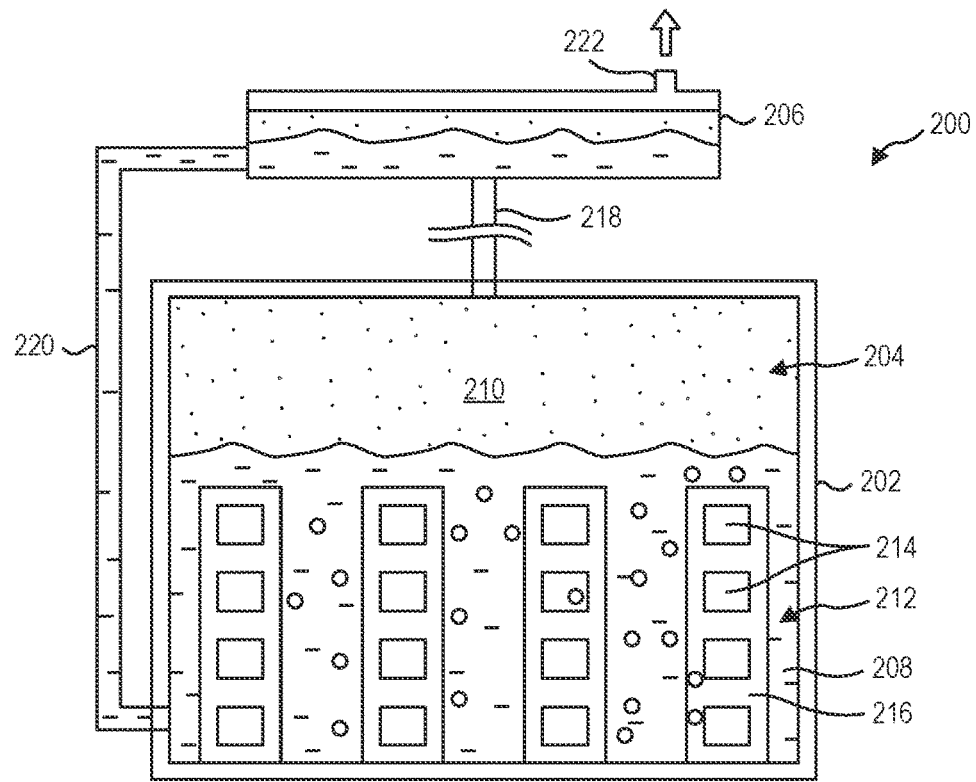
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiently remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 1000 Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Figure 3:
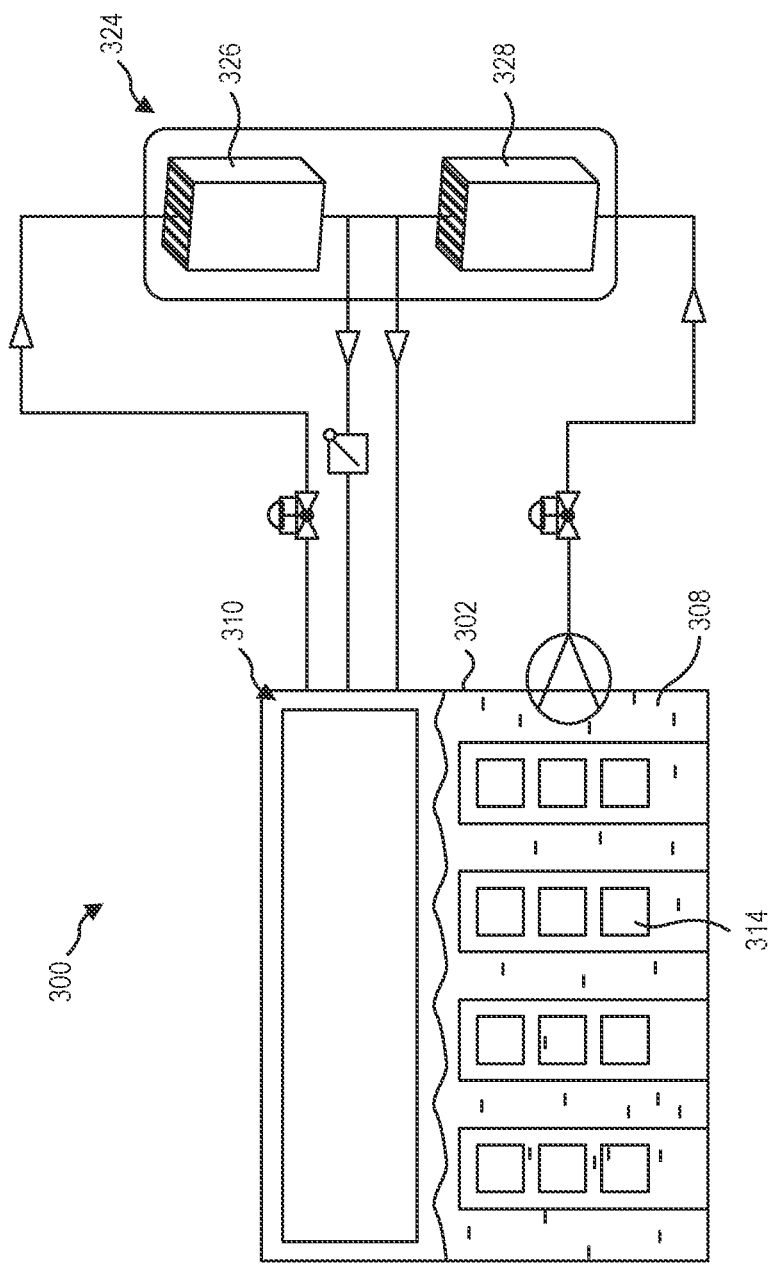
FIG. 3 is a system diagram of an immersion cooling system with a pressure trim device, according to at least one embodiment of the present disclosure.

FIG. 3 is a system diagram of an embodiment of an immersion cooling system 300 according to the present disclosure. A thermal management system, according to the present disclosure, includes at least one pressure trim device 324 in fluid communication with the immersion tank 302 to receive working fluid from and/or supply working fluid to the immersion chamber of the immersion tank 302. In some embodiments, the pressure trim device 324 includes a thermal sink that is pre-heated or pre-cooled to immediately begin changing a physical state of the working fluid upon contact with the thermal sink. In at least one embodiment, a thermal management system includes both a hot thermal sink 326 and a cold thermal sink 328 to selectively vaporize liquid working fluid 308 or condense vapor working fluid 310, respectively.

In some embodiments, a hot thermal sink includes a heating element and a thermal mass. The heating element heats the thermal mass. In some embodiments, the heating element includes a resistive heater. In some embodiments, the heating element is a solar heater. In some embodiments, the heating element includes a heat pump. In some embodiments, the heating element includes a combustion heater.

In some embodiments, the thermal mass stores sufficient thermal energy to vaporize a volume of liquid working fluid. For example, the two-phase cooling of the heat-generating components may be a substantially isothermal process in which the liquid working fluid in the immersion tank may be approximately at the boiling temperature of the working fluid in a liquid phase, and the heat received from the heat-generating components converts the liquid phase to a vapor phase without a substantial increase in temperature. However, the hot thermal sink will decrease in temperature as the thermal mass contributes heat to the liquid phase to overcome the latent heat of boiling.

Figure 4:
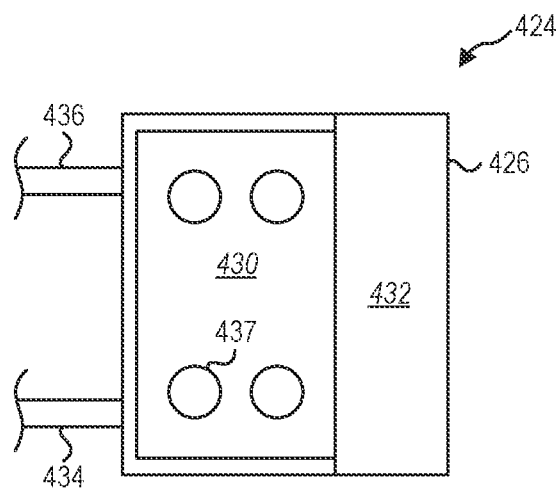
FIG. 4 is a side cross-sectional view of a pressure trim device with a cold thermal sink, according to at least one embodiment of the present disclosure.

FIG. 4 is a side cross-sectional view of an embodiment of a pressure trim device 424 with a hot thermal sink 426. The hot thermal sink 426 includes a thermal mass 430 and a heating element 432 configured to heat the thermal mass 430. In some embodiments during operation, the thermal mass 430 has thermal energy sufficient to vaporize at a portion of the tank vapor volume (e.g., headspace) of the immersion chamber at 1 ATM and at the boiling temperature of the working fluid. For example, the thermal mass 430 contains enough thermal energy to vaporize liquid working fluid to produce vapor working fluid that fills approximately 10% of the tank vapor volume at 1 ATM. In other examples, the thermal mass 430 contains enough thermal energy to vaporize liquid working fluid to produce vapor working fluid that fills approximately 20% of the tank vapor volume at 1 ATM. In yet other examples, the thermal mass 430 contains enough thermal energy to vaporize liquid working fluid to produce vapor working fluid that fills approximately 30% of the tank vapor volume at 1 ATM. The thermal energy of the hot thermal sink 426 is related to the mass of the thermal mass 430, the heat capacity of the thermal mass 430, and the temperature of the thermal mass 430 during operation.

The heating element 432 heats the thermal mass 430 to maintain the thermal mass 430 at an elevated temperature greater than a boiling temperature of the working fluid. For example, the temperature of the thermal mass 430 may be prevented from dropping below the boiling temperature of the working fluid. In some embodiments, the elevated temperature is at least 0.1° C. above the boiling temperature. In some embodiments, the elevated temperature is at least 1.0° C. above the boiling temperature. In some embodiments, the elevated temperature is at least 2.5° C. above the boiling temperature. In some embodiments, the elevated temperature is at least 5.0° C. above the boiling temperature. In some embodiments, the greater the elevated temperature is above the boiling temperature, the faster the vaporization rate of the working fluid. The hot thermal sink 426 is, therefore, able to vaporize at least a portion of a liquid working fluid with which the thermal mass 430 comes in contact through a liquid supply line 434 before returning the vaporized working fluid through a vapor return line 436.

In some embodiments of a thermal management system, a plurality of hot thermal sinks are used to selectively provide different volumes of the vapor working fluid to control the pressure in the immersion tank. For example, a single thermal sink that has sufficient thermal energy to produce vapor that fills 30% of the tank vapor volume at 1 ATM may, undesirably, over-pressurize the immersion tank. A set of three thermal sinks that each have sufficient thermal energy to produce vapor that fills 10% of the tank vapor volume at 1 ATM may pressurize the immersion tank in stages to maintain the pressure in a safe range while providing the same total vapor production capacity.

The thermal mass 430 of the hot thermal sink 426 may include one or more structures to increase surface area of the thermal mass 430 and/or increase a surface area-to-volume ratio. In some examples, a greater surface area can allow for more efficient and/or faster transfer of heat to the liquid working fluid to vaporize the working fluid. In some examples, the thermal mass 430 includes channels 437 or apertures through which the working fluid may flow through the thermal mass 430. In other examples, the thermal mass 430 includes surface features, such as ridges, ribs, pins, posts, fins, or other surface features to increase surface area of the thermal mass 430. In yet other examples, the thermal mass 430 includes both surface features and channels and/or apertures to increase the surface area-to-volume ratio.

In some embodiments, the thermal mass may have less or no surface features and/or a lower surface area-to-volume ratio to cause the thermal mass to vaporize the liquid working fluid at a slower rate. For example, it may be advantageous to provide vapor to the immersion tank at a slower rate to prevent over-pressurizing the chamber. In some embodiments, different hot thermal sinks have different size or shape thermal masses with different surface area-to-volume ratios. As described herein, different hot thermal sinks can, therefore, provide vapor to the immersion chamber in different volumes or at different rates.

Figure 5:
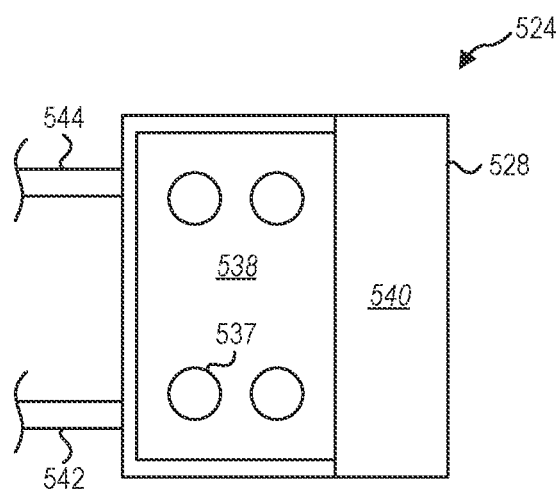
FIG. 5 is a side cross-sectional view of a pressure trim device with a hot thermal sink, according to at least one embodiment of the present disclosure.
Figure 6:
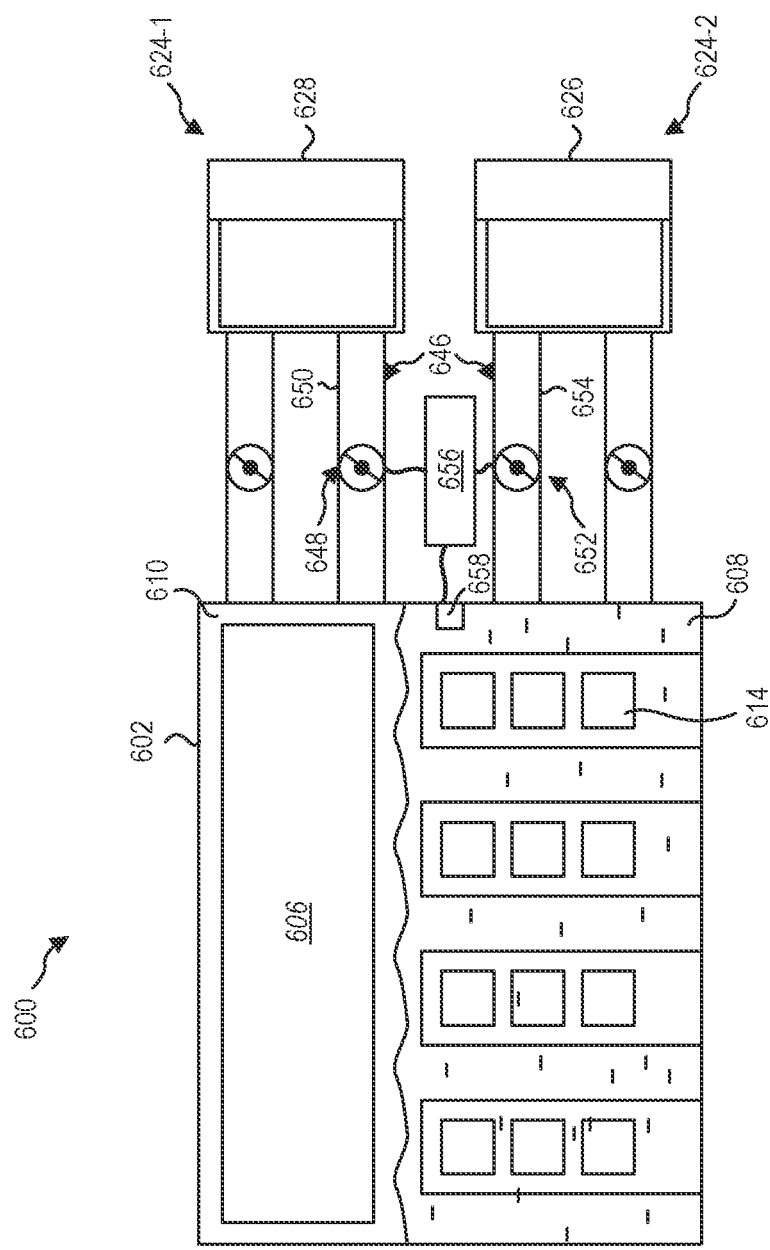
FIG. 6 is a system diagram of an immersion cooling system with a plurality of pressure trim devices, according to at least one embodiment of the present disclosure.

FIG. 5 is a side cross-sectional view of an embodiment of a pressure trim device 524 with a cold thermal sink 528. In some embodiments, a cold thermal sink 528 includes a cooling element 540 and a thermal mass 538. The cooling element 540 cools the thermal mass 538. In some embodiments, the cooling element 540 includes a solid-state cooler, such as a Peltier cooler. In some embodiments, the cooling element 540 includes a direct expansion (DX) cooling device, such as a cooling device including a compressor and expansion coil to cool the cooling element 540. In some embodiments, the cooling element 540 includes a heat pump. In some embodiments, a pressure trim device (such as the pressure trim device 324 of FIG. 3) includes both a hot thermal sink and a cold thermal sink. For example, the pressure trim device includes a cold thermal sink that shares a heat pump with a hot thermal sink to cool the cold thermal sink thermal mass and heat the hot thermal sink thermal mass.

In some embodiments, the cold thermal mass 538 has sufficient thermal energy capacity to condense a volume of vapor working fluid. For example, the two-phase cooling of the heat-generating components may be a substantially isothermal process in which the liquid working fluid in the immersion tank may be approximately at the boiling temperature of the working fluid in a liquid phase, and the heat received from the heat-generating components converts the liquid phase to a vapor phase without a substantial increase in temperature. However, the cold thermal sink 528 will increase in temperature as the cold thermal mass 538 receives heat from the vapor phase received through a vapor supply line 542 to overcome the latent heat of fusion.

In some embodiments, the cold thermal mass 538 has thermal energy capacity below the boiling temperature sufficient to condense at a portion of the tank vapor volume (e.g., headspace) of the immersion chamber at 1 ATM and at the boiling temperature of the working fluid. For example, the cold thermal mass 538 contains enough thermal energy capacity to condense vapor working fluid that fills approximately 10% of the tank vapor volume at 1 ATM to produce liquid working fluid. In other examples, the cold thermal mass 538 contains enough thermal energy capacity to condense vapor working fluid that fills approximately 20% of the tank vapor volume at 1 ATM to produce liquid working fluid. In yet other examples, the cold thermal mass 538 contains enough thermal energy capacity to condense vapor working fluid that fills approximately 30% of the tank vapor volume at 1 ATM to produce liquid working fluid. The thermal energy capacity of the cold thermal sink 528 is related to the mass of the cold thermal mass 538, the heat capacity of the cold thermal mass 538, and the temperature of the cold thermal mass 538.

The cooling element 540 cools the cold thermal mass 538 to maintain the cold thermal mass 538 at a suppressed temperature less than a boiling temperature of the working fluid. In some embodiments, the suppressed temperature is at least 0.1° C. above the boiling temperature. In some embodiments, the suppressed temperature is at least 1.0° C. above the boiling temperature. In some embodiments, the suppressed temperature is at least 2.5° C. above the boiling temperature. In some embodiments, the suppressed temperature is at least 5.0° C. above the boiling temperature. The cold thermal sink 528 is, therefore, able to condense at least a portion of a vapor working fluid with which the cold thermal mass 538 comes in contact, and the condensed working fluid may be returned through a liquid return line 544.

In some embodiments of a thermal management system, a plurality of cold thermal sinks are used to selectively condense different volumes of the vapor working fluid to reduce the pressure in the immersion tank. For example, a single thermal sink that has sufficient thermal energy capacity to condense vapor that fills 30% of the tank vapor volume at 1 ATM may, undesirably, under-pressurize the immersion tank (e.g., create a negative pressure relative to the ambient atmosphere). A set of three thermal sinks that each have sufficient thermal energy to condense vapor that fills 10% of the tank vapor volume at 1 ATM may depressurize the immersion tank in stages to maintain the pressure in a safe range while providing the same total vapor condensation capacity.

The cold thermal mass 538 of the cold thermal sink 528 may include one or more structures to increase surface area of the thermal mass and/or increase a surface area-to-volume ratio. In some examples, a greater surface area can allow for more efficient and/or faster transfer of heat from the vapor working fluid to condense the vapor working fluid. In some examples, the thermal mass includes channels 537 or apertures through which the working fluid may flow through the cold thermal mass 538. In other examples, the cold thermal mass 538 includes surface features, such as ridges, ribs, pins, posts, fins, or other surface features to increase surface area of the cold thermal mass 538. In yet other examples, the cold thermal mass 538 includes both surface features and channels and/or apertures to increase the surface area-to-volume ratio.

In some embodiments, the cold thermal mass 538 may have less or no surface features and/or a lower surface area-to-volume ratio to cause the thermal mass to condense the vapor working fluid at a slower rate. For example, it may be advantageous to condense vapor from the immersion tank at a slower rate to prevent under-pressurizing the chamber.

In some embodiments, different cold thermal sinks have different size or shape thermal masses with different surface area-to-volume ratios. As described herein, different cold thermal sinks can, therefore, condense vapor from the immersion chamber in different volumes or at different rates.

In some embodiments, the thermal management system 600 is configured to selectively allow at least a portion of the working fluid (e.g., liquid working fluid 608, vapor working fluid 610) from the immersion tank 602 used to cool the heat-generating components 614 to contact one or more of the pressure trim devices 624-1, 624-2. In some embodiments, the thermal management system includes a port, tube, channel, or other fluid conduit 646 to allow working fluid from the immersion tank 602 to enter the pressure trim device 624-1, 624-2 and/or contact a thermal sink.

In some embodiments, the fluid conduit 646 includes a fluid control mechanism 648 that selectively allows flow of working fluid from the immersion tank to the pressure trim device. For example, a vapor control mechanism 648 may include a vapor control valve in a vapor conduit 650 that, when in a closed position, limits and/or prevents flow of vapor working fluid from the immersion tank 602 to the cold thermal sink 628 and, when in an open position, allows flow of the vapor working fluid to the cold thermal sink 628. In some examples, the vapor control mechanism 648 includes a vapor control valve that has one or more intermediate positions between the closed position and the open position that allow a flow rate through the vapor control valve that is proportional and/or related to the position of the vapor control valve. For example, the vapor control valve may have a closed position, an open position, and a 50% position in which the area of the opening through the vapor control valve is approximately 50% of the area through the valve in the open position. In other examples, the vapor control valve may have a closed position, a 25% position, a 50% position, a 75% position, an open position, and any other intermediate positions therebetween. In at least one example, the valve position is continuously adjustable (e.g., positionable at any position between the closed position and the open position). The position of the vapor control valve may be selected by a user or by a controller 656 to select the flowrate (and hence mass) of vapor working fluid introduced from the immersion tank to the pressure trim device.

In some embodiments, the fluid conduit includes a control mechanism that includes a damper to adjust a flowrate of vapor working fluid from the immersion tank to the pressure trim device through the vapor conduit. In some embodiments, the fluid conduit includes a pressure gate that opens reactively and/or passively in the presence of a pressure differential across the pressure gate. For example, the pressure gate may remain in a closed position when there is no pressure differential between the immersion tank and the pressure trim device (e.g., when both are at 1 ATM). As the pressure differential increases, a net force is applied to the pressure gate in the conduit, and, when the pressure exceeds a threshold differential, the pressure gate may open to allow working fluid to flow through the conduit.

In some embodiments, as the vapor working fluid contacts a cold thermal sink 628 and condenses, the pressure in the pressure trim device 624-1 decreases, increasing the pressure differential between the immersion tank 602 and the pressure trim device 624-1. The increased pressure may then allow more working fluid to move through the pressure gate to be condensed in the pressure trim device 624-1.

In some embodiments, a liquid control mechanism 652 may include a liquid control valve in a liquid conduit 654 that, when in a closed position, limits and/or prevents flow of liquid working fluid 608 from the immersion tank 602 to the hot thermal sink 626 and, when in an open position, allows flow of the liquid working fluid 608 to the hot thermal sink 626. In some examples, the liquid control mechanism 652 includes a liquid control valve that has one or more intermediate positions between the closed position and the open position that allow a flow rate through the liquid control valve that is proportional and/or related to the position of the liquid control valve. For example, the liquid control valve may have a closed position, an open position, and a 50% position in which the area of the opening through the liquid control valve is approximately 50% of the area through the valve in the open position. In other examples, the liquid control valve may have a closed position, a 25% position, a 50% position, a 75% position, an open position, and any other intermediate positions therebetween. In at least one example, the valve position is continuously adjustable (e.g., positionable at any position between the closed position and the open position). The position of the liquid control valve may be selected by a user or by a controller 656 to select the flowrate (and hence mass) of liquid working fluid 608 introduced from the immersion tank 602 to the pressure trim device 624-2.

In some embodiments, the liquid conduit includes a control mechanism that includes a damper to adjust a flowrate of liquid working fluid from the immersion tank to the pressure trim device through the liquid conduit. In some embodiments, the liquid conduit includes a pressure gate that opens reactively and/or passively in the presence of a pressure differential across the pressure gate. For example, the pressure gate may remain in a closed position when there is no pressure differential between the immersion tank and the pressure trim device (e.g., when both are at 1 ATM). As the pressure differential increases, a net force is applied to the pressure gate in the liquid conduit, and, when the pressure exceeds a threshold differential, the pressure gate may open to allow liquid working fluid to flow through the liquid conduit.

However, the net force on the pressure gate would be toward the immersion tank 602 in the event of a negative pressure forming in the immersion tank 602. In some embodiments, as the liquid working fluid 608 contacts a hot thermal sink 626 and vaporizes, the pressure in the pressure trim device 624-2 increases, further increasing the pressure differential between the immersion tank 602 and the pressure trim device 624-2 and opening the pressure gate. The increased pressure may then allow more working fluid to move through the pressure gate to be vaporized in the pressure trim device 624-2. In some embodiments, the thermal management system includes a vapor check valve that allows the vaporized vapor working fluid to flow away from the hot thermal sink in a different fluid conduit and ensure one-way flow through each of the conduits in the system.

As described herein, some embodiments of a fluid control mechanism 648, 652 are reactive based on a pressure differential between the immersion tank 602 and the pressure trim device 624-1, 624-2. In some embodiments, the fluid control mechanism is a passively reactive control mechanism that reacts to pressure differentials without additional intervention from an electronic controller or sensors. In some embodiments, the fluid control mechanism 648, 652 is an active control mechanism, such as a motorized valve that is opened in response to one or more measurements from a sensor 658. In some embodiments, a pressure sensor 658 is in pressure communication with the immersion chamber of the immersion tank 602. For example, a pressure sensor may be in pressure communication with the immersion tank 602 when positioned in the immersion tank and exposed to the fluid pressure therein. In another example, a pressure sensor may be in pressure communication with the immersion tank 602 when positioned outside of the immersion tank but exposed to the fluid pressure therein through a conduit, such as a pipe. In some examples, a pressure sensor positioned in the immersion tank 602 may provide a pressure measurement to a controller 656 in data communication with a motorized valve (e.g., fluid control mechanism 648, 652). In response to the measurement(s) from the pressure sensor, the controller 656 may send an instruction to the motorized valve to open or close the valve.

In some embodiments, the sensor 658 is a tank liquid level sensor. For example, the controller 656 may open or close a fluid control mechanism 648, 652 based on a measured level of liquid working fluid in the immersion tank 602. In some examples, if the liquid level is low, a greater proportion of the working fluid is in a vapor phase, which may be associated with increased pressure in the tank. In some examples, if the liquid level is high, a greater proportion of the working fluid is in a liquid phase, which may be associated with decreased pressure in the tank.

In some embodiments, the sensor 658 is a temperature sensor. For example, if the vapor in the immersion tank 602 increases in temperature, the vapor working fluid may be receiving heat from the heat-generating components 614 directly, and the vapor working fluid may need to be cooled and/or condensed rapidly. Opening the vapor control mechanism 648 to the cold thermal sink 628 may cool the hot vapor and return colder liquid working fluid to the immersion tank. In another example, if the vapor in the immersion tank decreases in temperature, the condenser 606 of the immersion tank 602 may be condensing and/or cooling vapor working fluid at a higher rate than is desired, and the liquid working fluid in the immersion tank may need to be heated or vaporized rapidly to maintain pressure in the immersion tank in a desired range. Opening the liquid control mechanism 652 to the hot thermal sink 626 may heat the liquid working fluid 608 and return vapor working fluid 610 to the immersion tank 602.

The thermal management system 600 may include a proactive control mechanism that opens and/or closes a fluid conduit to a pressure trim device based at least partially on anticipated pressure changes. In some embodiments, a control service is in data communication with at least one of a VM or process allocator for the server computers in the immersion tank, one or more sensors in the immersion tank, and one or more control mechanisms of a fluid conduit to a pressure trim device.

In some embodiments, the controller 656 is a control service is in data communication with the fluid control mechanism(s) 648, 652 to control a mass of working fluid introduced to the pressure trim device(s) 624-1, 624-2. The control service determines a control mechanism position (e.g., the closed position, the open position, an intermediate position) based at least partially on one or more operating properties of one or more parts of the immersion cooling system. The operating properties are obtained by the control service from local and/or remote sensors 658, computing devices, storage devices, and combinations thereof.

In some embodiments, the control service is in data communication with one or more sensors 658 that measure operating properties of the heat-generating components, such as power draw of one or more computing devices or components, component temperature, or other real-time conditions of the computing devices and/or electronic components. For example, a sensor 658 may be a pressure sensor, a temperature sensor, a liquid level sensor, or other sensors that provide information regarding the conditions or operations of the immersion cooling system of the thermal management system. While embodiments of thermal management systems that are reactive to a sensor 658 measuring a condition outside of a threshold value, in some embodiments, the measurements are received by the control service, and the control service determines if the measurements indicate the pressure, temperature, liquid level, etc. will exceed a threshold value in the future, such as based on historical data or trends. For example, the control service may receive pressure measurements from a pressure sensor substantially continuously. When the control service receives measurements that indicate a trend of increasing pressure, the control service may send instructions to a valve, damper, bypass, or other fluid control mechanism to open or close, partially or fully, to adjust the mass of working fluid introduced to the pressure trim device(s).

In some embodiments, the control service obtains an operating property such as a virtual machine (VM) metadata, from a VM allocator, that includes information regarding computing tasks, operating demands, and VM allocations assigned to the computing devices, electronic components, or other heat-generating components 614 in the immersion tank(s) 602. For example, when the VM metadata indicates that the heat-generating components 614 of the immersion tank 602 are performing high-demand computational tasks, such as artificial intelligence, graphics processing, physical simulations, etc., the control service may proactively adjust the position of a fluid control mechanism to adjust the mass of working fluid introduced to the cold thermal sink(s) 628 to adjust the control mechanism to introduce more cooling capacity while the condenser 606 of the immersion tank 602 begins condensing the vapor working fluid 610. In another example, the VM metadata indicates that the heat-generating components 614 in the immersion tank 602 are idle, and the control service may adjust the position of a control mechanism to adjust the mass of liquid working fluid 608 introduced to the hot thermal sink(s) 626 to proactively increase or slow a decrease in pressure in the tank while the condenser 606 of the immersion tank 602 slows condensing the vapor working fluid 610.

In some embodiments, the control service is in communication with one or more thermal sink sensors that informs the control service of the current state of the thermal sink(s) 626, 628. For example, the hot thermal sink 626 may have recently been used to vaporize working fluid and may have limited thermal capacity. In some examples, the control service may have stored thereon or be in communication with a database of specifications of the pressure trim device(s), such as thermal capacity of the pressure trim device relative to temperature (e.g., thermal mass, heat capacity of the thermal mass material), size of the fluid conduit(s) that provide fluid communication between the immersion tank and the pressure trim device(s), or other specifications of the pressure trim device(s).

The control service, in some embodiments, has stored thereon and/or is in communication with a device inventory that includes operating properties such as server topology or topology of other electronic devices in the plurality of immersion tanks. In some embodiments, the device inventory includes information related to the components of computing devices in the plurality of immersion tanks. For example, the device inventory may include computing device identifications (ID), component information, operating temperature ranges, maximum operating temperatures, power draw properties, power efficiency properties. The device inventory informs the control service what computing devices or electronic components are located where in the plurality of immersion tanks and the properties of the computing devices or electronic components. The control service uses the device inventory to determine the thermal management needed to operate the computing devices or electronic components safely without damage to the computing devices or electronic components in the plurality of immersion tanks.

In some embodiments, the control service obtains operating properties of the immersion cooling system from one or more sensors 658. In some embodiments, the sensors 658 provide operating properties of the computing devices, electronic components, or other heat-generating components 614 in the immersion tank 602, such as power draw of one or more computing devices or components, component temperature, or other real-time conditions of the computing devices and/or electronic components.

The control service obtains, accesses, or receives operating properties of the immersion cooling system, and the computing device and/or electronic components therein, to determine a position of a control mechanism based at least partially on one or more specification of the pressure trim device(s), one or more measured properties of the pressure trim device(s), one or more operating properties of the immersion tank and/or the heat-generating components in the immersion tank to keep the pressure in the immersion tank in a desired range.

Figure 7:
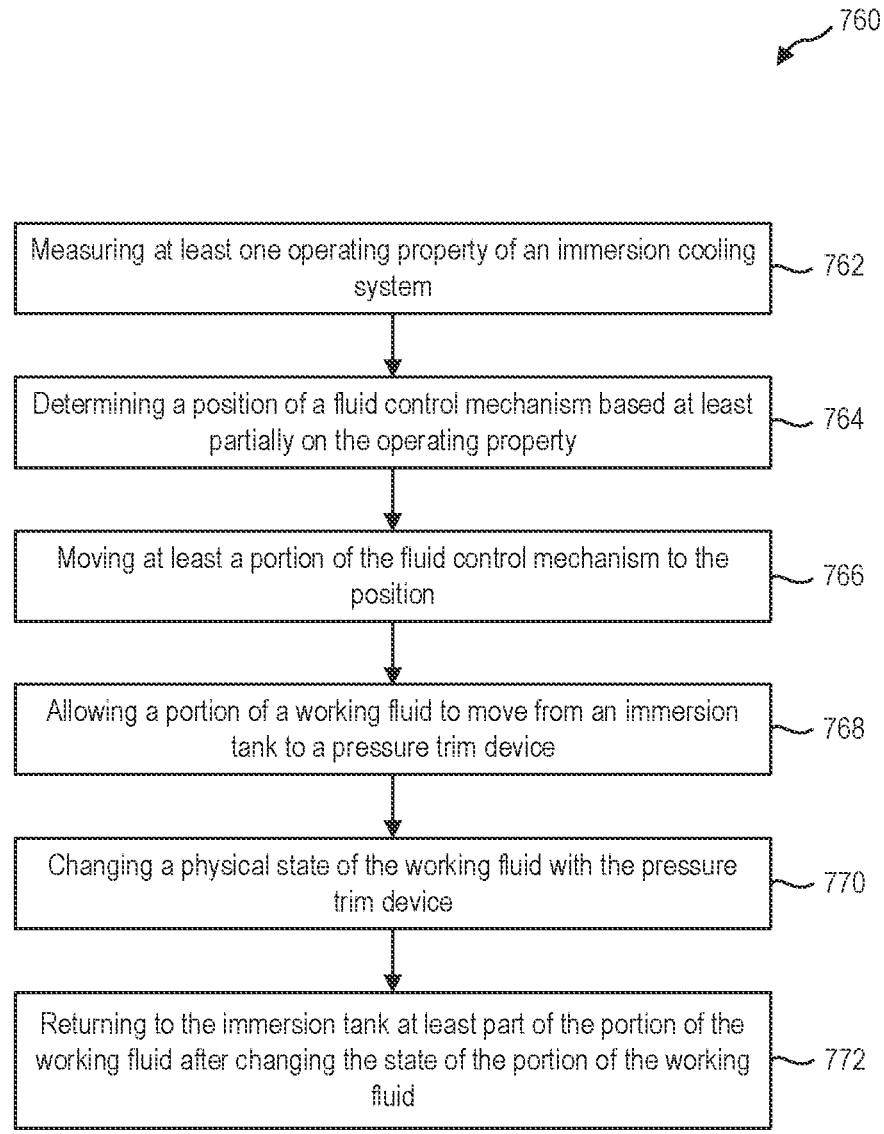
FIG. 7 is a flowchart illustrating a method of thermal management, according to at least one embodiment of the present disclosure.

FIG. 7 is a flowchart illustrating an embodiment of a method 760 of thermal management, according to the present disclosure. In some embodiments, a method 760 of thermal management includes measuring at least one operating property of an immersion cooling system at 762 and determining a position of a fluid control mechanism based at least partially on the operating property at 764. In some embodiments, the operating property is an operating property of the immersion tank, such as tank pressure, tank temperature, tank liquid level, etc. as described herein. The operating property of the immersion tank may be measured by a sensor in data communication with a controller or the operating property may be measured by the fluid control mechanism, such as a pressure gate or damper.

In some embodiments, the operating property may be an operating property of a heat-generating component, such as a server computer or an electronic component. The operating property of a heat-generating component may be a power draw, an energy consumption, a component temperature, an allocated process, or other operating properties related to the heat generation of the heat-generating component. The operating property may be received from a computer or controller, such as a VM allocator.

The operating property is used to determine a position of a fluid control mechanism based at least partially on the operating property. In some embodiments, the position of the fluid control mechanism is determined by a force applied directly or indirectly to the fluid control mechanism. In some embodiments, the position of the fluid control mechanism is determined by a controller after receiving a measured operating property from a sensor. In some embodiments, the position of the fluid control mechanism is determined by a controller based on changes in a measured operating property from a sensor. In some embodiments, the position of the fluid control mechanism is determined by a controller based on a computational load of one or more of the heat-generating components.

In some embodiments, the method further includes moving at least a portion of the fluid control mechanism at 766 to allow a portion of the working fluid to move from the immersion tank (or from a fluid conduit in communication with the immersion tank) to a pressure trim device at 768. In some embodiments, the portion of the working fluid includes a liquid phase of the working fluid. In some embodiments, the portion of the working fluid includes a vapor phase of the working fluid.

The method further includes changing a physical state of the portion of the working fluid with the pressure trim device at 770. In some embodiments, changing the state of the portion of the working fluid includes condensing the working fluid. In some embodiments, changing the state of the portion of the working fluid includes vaporizing the working fluid.

In some embodiments, the method 760 includes returning to the immersion tank at least part of the portion of the working fluid after changing the state of the portion of the working fluid at 772. For example, after condensing the portion of the working fluid, the method may include flowing the liquid working fluid from the pressure trim device toward the immersion tank. In another example, after vaporizing the portion of the working fluid, the method may include flowing the vapor working fluid from the pressure trim device toward the immersion tank.

INDUSTRIAL APPLICABILITY

The present disclosure relates generally to systems and methods for thermal management of electronic devices or other heat-generating components. In some embodiments, immersion cooling systems described herein allow for changes to be made to a fluid pressure in an immersion tank. The changes to the fluid pressure can maintain the fluid pressure within a safe range in the tank. For example, an immersion cooling system according to the present disclosure includes one or more pressure trim devices to vaporize or condense a portion of the working fluid to adjust the fluid pressure in the immersion tank.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small associated increase in temperature. Further, the lower density allows the vapor to be removed from the immersion bath efficiently to exhaust the associated heat from the system.

The changes in volume between the liquid phase and vapor phase of the working fluid changes the pressure in the immersion tank. In some embodiments, a condenser, heat exchanger, or other device for cooling the vapor working fluid cannot change state quickly enough to respond to changes in compute demand and/or heat-generation of the electronic components in the immersion tank. More specifically, the heat-generation by the electronic components in the immersion tank is based on electrical power consumption and compute load. Assignment of a computational task, and associate compute load of the server computers in the immersion tank, can change more rapidly than the thermal capacity of the condenser, heat-exchanger, or other device cooling the working fluid.

In an example, a step-increase in compute load produces a step-increase in vaporization rate of the working fluid by the heat-generating components, while a condenser tasked with condensing the vapor working fluid has a relatively prolonged reaction time before a steady-state is achieved. In the time between the heat-generating components vaporizing more working fluid and the condenser responding, the fluid pressure in the immersion tank may increase. In another example, a step-decrease in compute load produces a step-decrease in vaporization rate of the working fluid by the heat-generating components, while a condenser tasked with condensing the vapor working fluid has a relatively prolonged reaction time before a steady-state is achieved. In the time between the heat-generating components vaporizing more working fluid and the condenser responding, the fluid pressure in the immersion tank may decrease as the condenser continues condensing the vapor working fluid, despite the heat-generating components vaporizing less working fluid.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

A thermal management system, according to the present disclosure, includes at least one pressure trim device in fluid communication with the immersion tank to receive working fluid from and/or supply working fluid to the immersion tank. In some embodiments, the pressure trim device is a thermal sink that is pre-heated or pre-cooled to immediately begin changing a physical state of the working fluid. In at least one embodiment, a thermal management system includes both a hot thermal sink and a cold thermal sink to selectively vaporize working fluid or condense working fluid, respectively.

In some embodiments, a hot thermal sink includes a heating element and a thermal mass. The heating element heats the thermal mass. In some embodiments, the heating element includes a resistive heater. In some embodiments, the heating element is a solar heater. In some embodiments, the heating element includes a heat pump. In some embodiments, the heating element includes a combustion heater.

In some embodiments, the thermal mass stores sufficient thermal energy to vaporize a volume of liquid working fluid. For example, the two-phase cooling of the heat-generating components may be a substantially isothermal process in which the liquid working fluid in the immersion tank may be approximately at the boiling temperature of the working fluid in a liquid phase, and the heat received from the heat-generating components converts the liquid phase to a vapor phase without a substantial increase in temperature. However, the thermal sink will decrease in temperature as the thermal mass contributes heat to the liquid phase to overcome the latent heat of boiling.

In some embodiments, the thermal mass has thermal energy sufficient to vaporize at a portion of the tank vapor volume (e.g., headspace) of the immersion chamber at 1 ATM and at the boiling temperature of the working fluid. For example, the thermal mass contains enough thermal energy to vaporize liquid working fluid to produce vapor working fluid that fills approximately 10% of the tank vapor volume at 1 ATM. In other examples, the thermal mass contains enough thermal energy to vaporize liquid working fluid to produce vapor working fluid that fills approximately 20% of the tank vapor volume at 1 ATM. In yet other examples, the thermal mass contains enough thermal energy to vaporize liquid working fluid to produce vapor working fluid that fills approximately 30% of the tank vapor volume at 1 ATM. The thermal energy of the thermal sink is related to the mass of the thermal mass, the heat capacity of the thermal mass, and the temperature of the thermal mass.

The heating element heats the thermal mass to maintain the thermal mass at an elevated temperature greater than a boiling temperature of the working fluid. In some embodiments, the elevated temperature is at least 0.1° C. above the boiling temperature. In some embodiments, the elevated temperature is at least 1.0° C. above the boiling temperature. In some embodiments, the elevated temperature is at least 2.5° C. above the boiling temperature. In some embodiments, the elevated temperature is at least 5.0° C. above the boiling temperature. The thermal sink is, therefore, able to vaporize at least a portion of a liquid working fluid with which the thermal mass comes in contact.

In some embodiments of a thermal management system, a plurality of hot thermal sinks are used to selectively provide different volumes of the vapor working fluid to control the pressure in the immersion tank. For example, a single thermal sink that has sufficient thermal energy to produce vapor that fills 30% of the tank vapor volume at 1 ATM may, undesirably, over-pressurize the immersion tank. A set of three thermal sinks that each have sufficient thermal energy to produce vapor that fills 10% of the tank vapor volume at 1 ATM may pressurize the immersion tank in stages to maintain the pressure in a safe range while providing the same total vapor production capacity.

The thermal mass of the hot thermal sink may include one or more structures to increase surface area of the thermal mass and/or increase a surface area-to-volume ratio. In some examples, a greater surface area can allow for more efficient and/or faster transfer of heat to the liquid working fluid to vaporize the working fluid. In some examples, the thermal mass includes channels or apertures through which the working fluid may flow through the thermal mass. In other examples, the thermal mass includes surface features, such as ridges, ribs, pins, posts, fins, or other surface features to increase surface area of the thermal mass. In yet other examples, the thermal mass includes both surface features and channels and/or apertures to increase the surface area-to-volume ratio.

In some embodiments, the thermal mass may have less or no surface features and/or a lower surface area-to-volume ratio to cause the thermal mass to vaporize the liquid working fluid at a slower rate. For example, it may be advantageous to provide vapor to the immersion tank at a slower rate to prevent over-pressurizing the chamber. In some embodiments, different hot thermal sinks have different size or shape thermal masses with different surface area-to-volume ratios. As described herein, different hot thermal sinks can, therefore, provide vapor to the immersion chamber in different volumes or at different rates.

In some embodiments, a cold thermal sink includes a cooling element and a thermal mass. The cooling element cools the thermal mass. In some embodiments, the cooling element includes a solid-state cooler, such as a Peltier cooler. In some embodiments, the cooling element 540 includes a direct expansion (DX) cooling device, such as a cooling device including a compressor and expansion coil to expand a refrigerant to cool the cooling element 540 (e.g., as used in an air conditioning unit, a refrigerator, or other cooling unit). In some embodiments, the cooling element includes a heat pump. In some embodiments, the cold thermal sink shares a heat pump with a hot thermal sink to cool the cold thermal sink thermal mass and heat the hot thermal sink thermal mass.

In some embodiments, the thermal mass stores sufficient thermal energy to condense a volume of vapor working fluid. For example, the two-phase cooling of the heat-generating components may be a substantially isothermal process in which the liquid working fluid in the immersion tank may be approximately at the boiling temperature of the working fluid in a liquid phase, and the heat received from the heat-generating components converts the liquid phase to a vapor phase without a substantial increase in temperature. However, the cold thermal sink will increase in temperature as the thermal mass receives heat from the vapor phase to overcome the latent heat of fusion.

In some embodiments, the thermal mass has thermal energy capacity below the boiling temperature sufficient to condense at a portion of the tank vapor volume (e.g., headspace) of the immersion chamber at 1 ATM and at the boiling temperature of the working fluid. For example, the thermal mass contains enough thermal energy capacity to condense vapor working fluid that fills approximately 10% of the tank vapor volume at 1 ATM to produce liquid working fluid. In other examples, the thermal mass contains enough thermal energy capacity to condense vapor working fluid that fills approximately 20% of the tank vapor volume at 1 ATM to produce liquid working fluid. In yet other examples, the thermal mass contains enough thermal energy capacity to condense vapor working fluid that fills approximately 30% of the tank vapor volume at 1 ATM to produce liquid working fluid. The thermal energy capacity of the cold thermal sink is related to the mass of the thermal mass, the heat capacity of the thermal mass, and the temperature of the thermal mass.

The cooling element cools the thermal mass to maintain the thermal mass at a suppressed temperature less than a boiling temperature of the working fluid. In some embodiments, the suppressed temperature is at least 0.1° C. above the boiling temperature. In some embodiments, the suppressed temperature is at least 1.0° C. above the boiling temperature. In some embodiments, the suppressed temperature is at least 2.5° C. above the boiling temperature. In some embodiments, the suppressed temperature is at least 5.0° C. above the boiling temperature. The thermal sink is, therefore, able to condense at least a portion of a vapor working fluid with which the thermal mass comes in contact.

In some embodiments of a thermal management system, a plurality of cold thermal sinks are used to selectively condense different volumes of the vapor working fluid to reduce the pressure in the immersion tank. For example, a single thermal sink that has sufficient thermal energy capacity to condense vapor that fills 30% of the tank vapor volume at 1 ATM may, undesirably, under-pressurize the immersion tank (e.g., create a negative pressure relative to the ambient atmosphere). A set of three thermal sinks that each have sufficient thermal energy to condense vapor that fills 10% of the tank vapor volume at 1 ATM may depressurize the immersion tank in stages to maintain the pressure in a safe range while providing the same total vapor condensation capacity.

The thermal mass of the cold thermal sink may include one or more structures to increase surface area of the thermal mass and/or increase a surface area-to-volume ratio. In some examples, a greater surface area can allow for more efficient and/or faster transfer of heat from the vapor working fluid to condense the vapor working fluid. In some examples, the thermal mass includes channels or apertures through which the working fluid may flow through the thermal mass. In other examples, the thermal mass includes surface features, such as ridges, ribs, pins, posts, fins, or other surface features to increase surface area of the thermal mass. In yet other examples, the thermal mass includes both surface features and channels and/or apertures to increase the surface area-to-volume ratio.

In some embodiments, the thermal mass may have less or no surface features and/or a lower surface area-to-volume ratio to cause the thermal mass to condense the vapor working fluid at a slower rate. For example, it may be advantageous to condense vapor from the immersion tank at a slower rate to prevent under-pressurizing the chamber. In some embodiments, different cold thermal sinks have different size or shape thermal masses with different surface area-to-volume ratios. As described herein, different cold thermal sinks can, therefore, condense vapor from the immersion chamber in different volumes or at different rates.

The thermal management system is configured to selectively allow at least a portion of the working fluid from immersion tank used to cool the heat-generating components to contact one or more of the pressure trim devices. In some embodiments, the thermal management system includes a port, tube, channel, or other fluid conduit to allow working fluid from the immersion tank to enter the pressure trim device and/or contact a thermal sink.

In some embodiments, the fluid conduit includes a control mechanism that selectively allows flow of working fluid from the immersion tank to the pressure trim device. For example, a vapor control mechanism may include a vapor control valve in a vapor conduit that, when in a closed position, limits and/or prevents flow of vapor working fluid from the immersion tank to the cold thermal sink and, when in an open position, allows flow of the vapor working fluid to the cold thermal sink. In some examples, the vapor control mechanism includes a vapor control valve that has one or more intermediate positions between the closed position and the open position that allow a flow rate through the vapor control valve that is proportional and/or related to the position of the valve. For example, the vapor control valve may have a closed position, an open position, and a 50% position in which the area of the opening through the vapor control valve is approximately 50% of the area through the valve in the open position. In other examples, the vapor control valve may have a closed position, a 25% position, a 50% position, a 75% position, an open position, and any other intermediate positions therebetween. In at least one example, the valve position is continuously adjustable (e.g., positionable at any position between the closed position and the open position). The position of the vapor control valve may be selected by a user or by a controller to select the flowrate (and hence mass) of vapor working fluid introduced from the immersion tank to the pressure trim device.

In some embodiments, the fluid conduit includes a control mechanism that includes a damper to adjust a flowrate of vapor working fluid from the immersion tank to the pressure trim device through the vapor conduit. In some embodiments, the fluid conduit includes a pressure gate that opens reactively and/or passively in the presence of a pressure differential across the pressure gate. For example, the pressure gate may remain in a closed position when there is no pressure differential between the immersion tank and the pressure trim device (e.g., when both are at 1 ATM). As the pressure differential increases, a net force is applied to the pressure gate in the conduit, and, when the pressure exceeds a threshold differential, the pressure gate may open to allow working fluid to flow through the conduit.

In some embodiments, as the vapor working fluid contacts a cold thermal sink and condenses, the pressure in the pressure trim device decreases, increasing the pressure differential between the immersion tank and the pressure trim device. The increased pressure may then allow more working fluid to move through the pressure gate to be condensed in the pressure trim device.

In some embodiments, a liquid control mechanism may include a liquid control valve in a liquid conduit that, when in a closed position, limits and/or prevents flow of liquid working fluid from the immersion tank to the hot thermal sink and, when in an open position, allows flow of the liquid working fluid to the hot thermal sink. In some examples, the liquid control mechanism includes a liquid control valve that has one or more intermediate positions between the closed position and the open position that allow a flow rate through the valve that is proportional and/or related to the position of the liquid control valve. For example, the liquid control valve may have a closed position, an open position, and a 50% position in which the area of the opening through the liquid control valve is approximately 50% of the area through the liquid control valve in the open position. In other examples, the liquid control valve may have a closed position, a 25% position, a 50% position, a 75% position, an open position, and any other intermediate positions therebetween. In at least one example, the valve position is continuously adjustable (e.g., positionable at any position between the closed position and the open position). The position of the liquid control valve may be selected by a user or by a controller to select the flowrate (and hence mass) of liquid working fluid introduced from the immersion tank to the pressure trim device.

In some embodiments, the liquid conduit includes a control mechanism that includes a damper to adjust a flowrate of liquid working fluid from the immersion tank to the pressure trim device through the liquid conduit. In some embodiments, the liquid conduit includes a pressure gate that opens reactively and/or passively in the presence of a pressure differential across the pressure gate. For example, the pressure gate may remain in a closed position when there is no pressure differential between the immersion tank and the pressure trim device (e.g., when both are at 1 ATM). As the pressure differential increases, a net force is applied to the pressure gate in the liquid conduit, and, when the pressure exceeds a threshold differential, the pressure gate may open to allow liquid working fluid to flow through the liquid conduit.

However, the net force on the pressure gate would be toward the immersion tank in the event of a negative pressure forming in the immersion tank. In some embodiments, as the liquid working fluid contacts a hot thermal sink and vaporizes, the pressure in the pressure trim device increases, further increasing the pressure differential between the immersion tank and the pressure trim device and opening the pressure gate rapidly. The increased pressure may then allow more working fluid to move through the pressure gate to be vaporized in the pressure trim device. In some embodiments, the thermal management system includes a vapor check valve that allows the vaporized vapor working fluid to flow away from the hot thermal sink in a different fluid conduit and ensure one-way flow through each of the conduits in the system.

As described herein, some embodiments of a fluid control mechanism are reactive based on a pressure differential between the immersion tank and the pressure trim device. In some embodiments, the fluid control mechanism is a passively reactive control mechanism that reacts to pressure differentials without additional intervention from an electronic controller or sensors. In some embodiments, the fluid control mechanism is an active control mechanism, such as a motorized valve that is opened in response to one or more measurements from a sensor. In some embodiments, a pressure sensor 658 is in pressure communication with the immersion chamber of the immersion tank 602. For example, a pressure sensor may be in pressure communication with the immersion tank 602 when positioned in the immersion tank and exposed to the fluid pressure therein. In another example, a pressure sensor may be in pressure communication with the immersion tank 602 when positioned outside of the immersion tank but exposed to the fluid pressure therein through a conduit, such as a pipe. For example, a pressure sensor positioned in the immersion tank may provide a pressure measurement to a controller in data communication with a motorized valve. In response to the measurement(s) from the pressure sensor, the controller may send an instruction to the motorized valve to open or close the valve.

In some embodiments, the sensor is a tank liquid level sensor. For example, the controller may open or close a control mechanism based on a measured level of liquid working fluid in the immersion tank. In some examples, if the liquid level is low, a greater proportion of the working fluid is in a vapor phase, which may be associated with increased pressure in the tank. In some examples, if the liquid level is high, a greater proportion of the working fluid is in a liquid phase, which may be associated with decreased pressure in the tank.

In some embodiments, the sensor is a temperature sensor. For example, if the vapor in the immersion tank increases in temperature, the vapor working fluid may be receiving heat from the heat-generating components directly, and the vapor working fluid may need to be cooled and/or condensed rapidly. Opening the vapor control mechanism to the cold thermal sink may cool the hot vapor and return colder liquid working fluid to the immersion tank. In another example, if the vapor in the immersion tank decreases in temperature, the condenser of the immersion tank may be condensing and/or cooling vapor working fluid at a higher rate than is desired, and the liquid working fluid in the immersion tank may need to be heated or vaporized rapidly to maintain pressure in the immersion tank in a desired range. Opening the liquid control mechanism to the hot thermal sink may heat the liquid working fluid and return vapor working fluid to the immersion tank.

The thermal management system may include a proactive control mechanism that opens and/or closes a fluid conduit to a pressure trim device based at least partially on anticipated pressure changes. In some embodiments, a control plane is in data communication with at least one of a VM or process allocator for the server computers in the immersion tank, one or more sensors in the immersion tank, and one or more control mechanisms of a fluid conduit to a pressure trim device.

In some embodiments, the control service is in data communication with the control mechanism(s) to control a mass of working fluid introduced to the pressure trim device(s). The control service determines a control mechanism position (e.g., the closed position, the open position, an intermediate position) based at least partially on one or more operating properties of one or more parts of the immersion cooling system. The operating properties are obtained by the control service from local and/or remote sensors, computing devices, storage devices, and combinations thereof.

In some embodiments, the control service is in data communication with one or more sensors that measure operating properties of the heat-generating components, such as power draw of one or more computing devices or components, component temperature, or other real-time conditions of the computing devices and/or electronic components. For example, a sensor may be a pressure sensor, a temperature sensor, a liquid level sensor, or other sensors that provide information regarding the conditions or operations of the immersion cooling system of the thermal management system. While embodiments of thermal management systems that are reactive to a sensor measuring a condition outside of a threshold value, in some embodiments, the measurements are received by the control service and the control service determines if the measurements indicate the pressure, temperature, liquid level, etc. will exceed a threshold value. For example, the control service may receive pressure measurements from a pressure sensor substantially continuously. When the control service receives measures that indicate a trend of increasing pressure, the control service may send instructions to a valve, damper, bypass, or other fluid control device to open or close, partially or fully, to adjust the mass of working fluid introduced to the pressure trim device(s).

In some embodiments, the control service obtains an operating property such as a virtual machine (VM) metadata, from a VM allocator, that includes information regarding computing tasks, operating demands, and VM allocations assigned to the computing devices, electronic components, or other heat-generating components in the immersion tank(s). For example, when the VM metadata indicates that the heat-generating components of the immersion tank are performing high-demand computational tasks, such as artificial intelligence, graphics processing, physical simulations, etc., the control service may proactively adjust the position of a control mechanism to adjust the mass of working fluid introduced to the cold thermal sink(s) to introduce more cooling capacity while the condenser of the immersion tank begins condensing the vapor working fluid. In another example, the VM metadata indicates that the computing devices in the immersion tank are idle, and the control service may adjust the position of a control mechanism to adjust the mass of working fluid introduced to the hot thermal sink(s) to proactively increase or slow a decrease in pressure in the tank while the condenser of the immersion tank slows condensing the vapor working fluid.

In some embodiments, the control service is in communication with one or more thermal sink sensors that informs the control service of the current state of the thermal sink. For example, the hot thermal sink may have recently been used to vaporize working fluid and may have limited thermal capacity. In some examples, the control service may have stored thereon or be in communication with a database of specifications of the pressure trim device(s), such as thermal capacity of the pressure trim device relative to temperature (e.g., thermal mass, heat capacity of the thermal mass material), size of the fluid conduit(s) that provide fluid communication between the immersion tank and the pressure trim device(s), or other specifications of the pressure trim device(s).

The control service, in some embodiments, has stored thereon and/or is in communication with a device inventory that includes operating properties such as server topology or topology of other electronic devices in the plurality of immersion tanks. In some embodiments, the device inventory includes information related to the components of computing devices in the plurality of immersion tanks. For example, the device inventory may include computing device identifications (ID), component information, operating temperature ranges, maximum operating temperatures, power draw properties, power efficiency properties. The device inventory informs the control service what computing devices or electronic components are located where in the plurality of immersion tanks and the properties of the computing devices or electronic components. The control service uses the device inventory to determine the thermal management needed to operate the computing devices or electronic components safely without damage to the computing devices or electronic components in the plurality of immersion tanks.

In some embodiments, the control service obtains operating properties of the immersion cooling system from one or more sensors. In some embodiments, the sensors provide operating properties of the computing devices and/or electronic components in the plurality of immersion tanks, such as power draw of one or more computing devices or components, component temperature, or other real-time conditions of the computing devices and/or electronic components.

The control service obtains, accesses, or receives operating properties of the immersion cooling system, and the computing device and/or electronic components therein, to determine a position of a control mechanism based at least partially on one or more specification of the pressure trim device(s), one or more measured properties of the pressure trim device(s), one or more operating properties of the immersion tank and/or the heat-generating components in the immersion tank to keep the pressure in the immersion tank in a desired range.

In some embodiments, a method of thermal management includes measuring at least one operating property of an immersion cooling system and determining a position of a fluid control mechanism based at least partially on the operating property. In some embodiments, the operating property is an operating property of the immersion tank, such as tank pressure, tank temperature, tank liquid level, etc. as described herein. The operating property of the immersion tank may be measured by a sensor in data communication with a controller or the operating property may be measured by the fluid control mechanism, such as a pressure gate or damper.

In some embodiments, the operating property may be an operating property of a heat-generating component, such as a server computer or an electronic component. The operating property of a heat-generating component may be a power draw, an energy consumption, a component temperature, an allocated process, or other operating properties related to the heat generation of the heat-generating component. The operating property may be received from a computer or controller, such as a VM allocator.

The operating property is used to determine a position of a fluid control mechanism based at least partially on the operating property. In some embodiments, the position of the fluid control mechanism is determined by a force applied directly or indirectly to the fluid control mechanism. In some embodiments, the position of the fluid control mechanism is determined by a controller after receiving a measured operating property from a sensor. In some embodiments, the position of the fluid control mechanism is determined by a controller based on changes in a measured operating property from a sensor. In some embodiments, the position of the fluid control mechanism is determined by a controller based on a computational load of one or more of the heat-generating components.

In some embodiments, the method further includes moving at least a portion of the fluid control mechanism to allow a portion of the working fluid to move from the immersion tank (or from a fluid conduit in communication with the immersion tank) to a pressure trim device. In some embodiments, the portion of the working fluid includes a liquid phase of the working fluid. In some embodiments, the portion of the working fluid includes a vapor phase of the working fluid.

The method further includes changing a state of the portion of the working fluid with the pressure trim device. In some embodiments, changing the state of the portion of the working fluid includes condensing the working fluid. In some embodiments, changing the state of the portion of the working fluid includes vaporizing the working fluid.

In some embodiments, the method includes returning to the immersion tank at least part of the portion of the working fluid after changing the state of the portion of the working fluid. For example, after condensing the portion of the working fluid, the method may include flowing the liquid working fluid from the pressure trim device toward the immersion tank. In another example, after vaporizing the portion of the working fluid, the method may include flowing the vapor working fluid from the pressure trim device toward the immersion tank.

The present disclosure relates to systems and methods for cooling heat-generating components of a computer or computing device according to at least the examples provided in the sections below:

[A1] In some embodiments, a thermal management system includes an immersion tank defining an immersion chamber, a two-phase working fluid positioned in the immersion chamber, and a pressure trim device in fluid communication with the immersion chamber. The pressure trim device includes at least one of a cold thermal sink and a hot thermal sink. The cold thermal sink is maintained at a suppressed temperature less than a boiling temperature of the two-phase working fluid. The hot thermal sink is maintained at an elevated temperature greater than a boiling temperature of the two-phase working fluid.

[A2] In some embodiments, the thermal management system of [A1] including a liquid control valve configured to selectively allow fluid communication between the immersion chamber and the hot thermal sink.

[A3] In some embodiments, the thermal management system of [A1] or [A2] includes a vapor control valve configured to selectively allow fluid communication between the immersion chamber and the cold thermal sink.

[A4] In some embodiments, the thermal management system of any of [A1] through [A3] includes a pressure sensor in pressure communication with the immersion chamber.

[A5] In some embodiments, the hot thermal sink of any of [A1] through [A4] has a thermal capacity configured to vaporize a volume of working fluid in a vapor phase at least 10% of a tank vapor volume at the boiling temperature and 1 Atmosphere of pressure (ATM).

[A6] In some embodiments, the cold thermal sink of any of [A1] through [A5] has a thermal capacity configured to condense a volume of a vapor phase of the two-phase working fluid at least 10% of a tank vapor volume at the boiling temperature and 1 ATM.

[A7] In some embodiments, the hot thermal sink of any of [A1] through [A6] is in fluid communication with the immersion chamber via a vapor return line.

[A8] In some embodiments, the cold thermal sink of any of [A1] through [A7] is configured to be cooled by a direct expansion cooling device.

[A9] In some embodiments, the cold thermal sink of any of [A1] through [A7] is configured to be cooled by a solid-state cooler.

[A10] In some embodiments, the hot thermal sink of any of [A1] through [A9] is configured to be heated by a resistive heater.

[A11] In some embodiments, the hot thermal sink of any of [A1] through [A9] is configured to be heated by a solar heater.

[A12] In some embodiments, the thermal management system of any of [A1] through [A11] further includes a heat pump configured to heat a portion of the hot thermal sink and cool a portion of the cold thermal sink.

[B1] In some embodiments, a thermal management system includes an immersion tank defining an immersion chamber, a two-phase working fluid positioned in the immersion chamber, a pressure trim device in fluid communication with the immersion chamber, a fluid control mechanism, and a controller. The pressure trim device includes at least one of a cold thermal sink and a hot thermal sink. The cold thermal sink is maintained at a suppressed temperature less than a boiling temperature of the two-phase working fluid. The hot thermal sink is maintained at an elevated temperature greater than a boiling temperature of the two-phase working fluid. The fluid control mechanism is configured to adjust a flowrate of working fluid from the immersion tank to the pressure trim device. The controller is in communication with the fluid control mechanism to control a position of the fluid control mechanism.

[B2] In some embodiments, the controller of [B1] is in data communication with a virtual machine (VM) allocator.

[B3] In some embodiments, the thermal management system of [B1] or [B2] includes at least one sensor positioned in the immersion tank to measure an operating property of the immersion tank, and the sensor is in data communication with the controller.

[B4] In some embodiments, the controller of any of [B1] through [B3] is configured to proactively adjust the position of the fluid control mechanism based on a trend in an operating property.

[C1] In some embodiments, a method of thermal management includes measuring at least one operating property of an immersion cooling system, determining a position of a fluid control mechanism based at least partially on the operating property, moving at least a portion of the fluid control mechanism to the position, allowing a portion of a working fluid to move from an immersion tank to a pressure trim device, changing a physical state of the working fluid with the pressure trim device, and returning to the immersion tank at least part of the portion of the working fluid after changing the physical state of the portion of the working fluid.

[C2] In some embodiments, the operating property of [C1] is a pressure inside of an immersion tank of the immersion cooling system.

[C3] In some embodiments, determining a position of a fluid control mechanism of [C1] or [C2] includes comparing a measured operating property against a threshold value.

[C4] In some embodiments, moving the portion of the fluid control mechanism of any of [C1] through [C3] includes sending an instruction to a motor.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system for thermal management of electronic devices comprising:
    an immersion tank defining an immersion chamber;
    a two-phase working fluid positioned in the immersion chamber;
    a pressure trim device in fluid communication with the immersion chamber, wherein a portion of a working fluid moves from the immersion tank to a pressure trim device, the pressure trim device including:
        a cold thermal sink maintained at a suppressed temperature less than a boiling temperature of the two-phase working fluid, and
        a hot thermal sink maintained at an elevated temperature greater than the boiling temperature of the two-phase working fluid; and
    a fluid control mechanism configured to control the movement of the portion of the working fluid to the pressure trim device based on a pressure within the immersion tank.

2. The thermal management system of claim 1, further comprising a liquid control valve configured to selectively allow fluid communication between the immersion chamber and the hot thermal sink.

3. The thermal management system of claim 1, further comprising a vapor control valve configured to selectively allow fluid communication between the immersion chamber and the cold thermal sink.

4. The thermal management system of claim 1, further comprising a pressure sensor in pressure communication with the immersion chamber.

5. The thermal management system of claim 1, wherein the hot thermal sink has a thermal capacity configured to vaporize a volume of working fluid in a vapor phase at least 10% of a tank vapor volume at the boiling temperature and 1 Atmosphere of pressure (ATM).

6. The thermal management system of claim 1, wherein the cold thermal sink has a thermal capacity configured to condense a volume of a vapor phase of the two-phase working fluid at least 10% of a tank vapor volume at the boiling temperature and 1 ATM.

7. The thermal management system of claim 1, wherein the hot thermal sink is in fluid communication with the immersion chamber via a vapor return line.

8. The thermal management system of claim 1, wherein the cold thermal sink is configured to be cooled by a direct expansion cooling device.

9. The thermal management system of claim 1, wherein the cold thermal sink is configured to be cooled by a solid-state cooler.

10. The thermal management system of claim 1, wherein the hot thermal sink is configured to be heated by a resistive heater.

11. The thermal management system of claim 1, wherein the hot thermal sink is configured to be heated by a solar heater.

12. The thermal management system of claim 1 further comprising a heat pump configured to heat a portion of the hot thermal sink and cool a portion of the cold thermal sink.

13. A thermal management system for thermal management of electronic devices comprising,
    an immersion tank defining an immersion chamber;
    a two-phase working fluid positioned in the immersion chamber; and
    a pressure trim device in fluid communication with the immersion chamber, wherein a portion of a working fluid moves from the immersion tank to a pressure trim device, the pressure trim device including:
        a cold thermal sink maintained at a suppressed temperature less than a boiling temperature of the two-phase working fluid, and
        a hot thermal sink maintained at an elevated temperature greater than the boiling temperature of the two-phase working fluid; and
    a fluid control mechanism configured to adjust a flowrate of working fluid from the immersion tank to the pressure trim device
    a pressure sensor positioned in the immersion tank to provide a pressure measurement; and
    a controller in communication with the fluid control mechanism to control a position of the fluid control mechanism based on the pressure measurement.

14. The thermal management system of claim 13, wherein the controller is in data communication with a virtual machine (VM) allocator.

15. The thermal management system of claim 13, further comprising at least one sensor positioned in the immersion tank to measure an operating property of the immersion tank, and the sensor is in data communication with the controller.

16. The thermal management system of claim 13, wherein the controller is configured to proactively adjust the position of the fluid control mechanism based on a trend in an operating property.

17. A method of thermal management for thermal management of electronic devices comprising:
    measuring at least one operating property of an immersion cooling system, wherein the operating property is pressure within the immersion cooling system;
    determining a position of a fluid control mechanism based at least partially on the operating property;
    moving at least a portion of the fluid control mechanism to the position;
    allowing a portion of a working fluid to move from an immersion tank to a pressure trim device, wherein the pressure trim device includes a cold thermal sink and a hot thermal sink maintained at an elevated temperature greater than a boiling temperature of the working fluid;
    changing a physical state of the working fluid with the pressure trim device; and returning to the immersion tank at least part of the portion of the working fluid after changing the physical state of the portion of the working fluid.

18. The method of claim 17, wherein determining a position of a fluid control mechanism includes comparing a measured operating property against a threshold value.

19. The method of claim 17, wherein moving the portion of the fluid control mechanism includes sending an instruction to a motor.

* * * * *